United States Patent
Tao et al.

(10) Patent No.: US 6,242,350 B1
(45) Date of Patent: Jun. 5, 2001

(54) POST GATE ETCH CLEANING PROCESS FOR SELF-ALIGNED GATE MOSFETS

(75) Inventors: Hun-Jan Tao; Chia-Shiung Tsai; Yuan-Chang Huang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/270,594

(22) Filed: Mar. 18, 1999

(51) Int. Cl.$^7$ .................................................. H01L 21/00
(52) U.S. Cl. .............................. 438/690; 134/1.2; 216/67; 216/79; 438/714; 438/715; 438/734; 438/725
(58) Field of Search ....................................... 438/690, 710, 438/712, 714, 715, 719, 720, 734, 725; 216/67, 79; 134/1.1, 1.2, 1.3

(56) References Cited

U.S. PATENT DOCUMENTS

| | | | |
|---|---|---|---|
| 4,983,254 | 1/1991 | Fujimura et al. | 156/643 |
| 5,057,187 | * 10/1991 | Shinagawa et al. | 438/725 |
| 5,597,983 | 1/1997 | Nguyen et al. | 174/264 |
| 6,107,202 | * 8/2000 | Chiu et al. | 438/690 |

OTHER PUBLICATIONS

Wolf et al., "Silicon Processing for the VLSI Era", vol. 1 : Process Technology, Lattice Press, Sunset Beach, Ca, (1986), p. 516.

* cited by examiner

*Primary Examiner*—William Powell
(74) *Attorney, Agent, or Firm*—George O. Saile; Stephen B. Ackerman

(57) ABSTRACT

A method for removing residual photoresist and polymer residues from silicon wafers after a polysilicon plasma etch with minimal gate oxide loss is described. The method is particularly useful for cleaning wafers after polysilicon or polycide gate etching in MOSFET with when very thin gate oxides (<100Å). In order to etch the final portion of the polysilicon gate structure including an over etch to removed isolated polysilicon patches, an etchant containing HBr is used to provide a high polysilicon to gate oxide selectivity. This etch component causes a polymer veil to form over the surface of the photoresist which is difficult to remove except by aqueous etchants which also cause significant gate oxide loss. The method of the invention addresses the removal of the veil polymer, the photoresist, and a sidewall polymer by an all dry etching process. In a first all dry process, the residues and photoresist and sidewall polymers are removed in a commercial ICP plasma asher by a sequence of steps using $O_2/N_2$ mixtures and a single O2/fluorocarbon step to remove the veil polymer. An alternate cleaning procedure removes the veil polymer with a $O_2/N_2/H_2$ gas mixtures at a low substrate temperature and the photoresist and sidewall polymers at a higher temperature. Maximum gate oxide loss by either method is less than 10 Å.

25 Claims, 3 Drawing Sheets

POST GATE ETCH CLEANING PROCESS FOR SELF-ALIGNED GATE MOSFETS

BACKGROUND OF THE INVENTION (1) Field of the Invention

The invention relates to processes for the manufacture of semiconductor devices and more particularly to processes for forming self-aligned polysilicon gate field effect transistors.

(2) Description of prior art and background to the invention

Complimentary metal oxide semiconductor(CMOS) field effect transistor(FET) technology involves the formation n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

A MOSFET is formed by a self-aligned gate process. Referring to FIG. 1, there is shown a cross section of a wafer 10 illustrating the formation of a polycide gate MOSFET. A gate oxide 12 is grown on an exposed surface of the silicon wafer 10 and a conductive layer 14 is deposited over it. The conductive layer 14 is typically a polycide layer which is a composite layer comprising a bottom portion formed of polysilicon and a top portion formed of a transition metal silicide, for example $WSi_x$. The term polycide is commonly used to refer to a silicide-over-polysilicon composite layer. To pattern a polycide gate electrode, a photoresist layer 16 is deposited over the polycide layer 14 and patterned by photolithography. In order to reduce surface reflections from the polycide during the photolithography, an organic BARC (bottom anti reflective coating) 18 is often included under the photoresist layer 16.

Referring to FIG. 2, the polycide layer 14 is etched to the gate oxide 12 by an anisotropic plasma etching technique, for example reactive ion etching (RIE), to forming the gate electrode 20. The etchants used generally contain $Cl_2$ and HBr and are selected to provide a high polysilicon-to-silicon oxide selectivity so that the gate oxide layer functions as an etch stop and further permits an over etch period whereby residual pockets of polysilicon are removed.

After the gate electrode 20 has been patterned, residues of various types remain behind on the wafer which must be removed by a cleaning process. FIG. 2 shows a cross section of a polycide gate electrode after the gate electrode 14 has been defined by a plasma etch. A polymer veil 22 is formed over the residual photoresist layer. The veil 22 formation results from the use of HBr in the final polysilicon etch step. HBr is used in this process to achieve a high etch rate selectivity of polysilicon to silicon oxide during the last stages of etching and in required over etch period. A second polymer 24 forms on the sidewalls of the gate electrode 20. Additional patches 26 of this polymer are also found on the surface of the gate oxide 12. These polymer deposits result from chemical reactions which occur during the plasma etching process and are silicaceous as well as carbonaceous. During plasma etching, the sidewall polymer 24 plays the important role of protecting the walls of the gate electrode from etchant undercutting, thereby enabling a vertical sidewall profile.

In conventional practice the residual photoresist layer 16 and the organic BARC 18 are removed by ashing in a plasma containing oxygen. The polymer layers cannot be removed by the conventional oxygen ashing process and are removed by a dip in dilute aqueous HF or in $NH_4OH$.

After polymer is removal, the wafer is subjected to RCA cleaning. The RCA cleaning method which uses $NH_4OH/H_2O_2$ and $HCl/H_2O_2$ solutions is well known and has been used for many years to clean particulates and other chemical residues from silicon wafers. A discussion of the RCA technique may be found in Wolf, S. and Tauber, R. N., "Silicon Processing for the VLSI Era", Vol.1, Lattice Press, Sunset Beach, Calif., (1986),p516ff. The ammoniacal solution is effective for removing organic residues and particulates while the acidic solution removes metallic contaminants.

The RCA cleaning process, by itself, is effective at removing the sidewall polymer but cannot remove the polymer veil, necessitating the inclusion of the HF or $NH_4OH$ dip prior to the RCA process. Unfortunately, both HF and $NH_4OH$ attack the gate oxide which lies exposed after the gate etch. Etching with dilute HF to properly remove all the polymer also removes some 20 to 40 Å of the gate oxide. The oxide loss when $NH_4OH$ is used is only slightly less. This problem is of particular concern for gate oxides less than 50 Angstroms thick when all or nearly all of the remaining gate oxide may be lost. Nguyen, et. al., U.S. Pat. No. 5,597,983 cite the use of tetramethyl ammonium hydroxide(TMAH) to remove polymer from plasma etched via openings in over aluminum. However, TMAH not only etches silicon oxide at a measurable rate it also attacks silicon at a rate of about 1,000 Å/sec. and is thus unsuitable for removing polymer after the polycide gate etch. It is therefore highly desirable to have a simple and selective method for removing both sidewall polymer and the polymer veil over the photoresist layer without compromising the gate oxide or the polycide structure.

Fujimura, et. al. U.S. Pat. No. 4,983,254 show a photoresist stripping process administered in a downstream ashing reactor by adding $H_2O$ to a gas mixture containing $O_2$ and a halogen bearing species. The $H_2O$ suppresses the oxide etch rate but also suppresses the ashing rate. The added $H_2O$ removes fluorine atoms before they reach the oxide, thereby lowering the oxide etch rate. The number of oxygen atoms participating in the ashing is increased by the removal of the halogen atoms. The method is a single flow process step whereby oxide etch rate, ashing rate and ashing temperature are balanced to achieve an optimal low temperature high ashing rate with minimal oxide loss. It is not known whether this process can remove the veil polymer on photoresist exposed to HBr etching. However, because the process is relatively inflexible it is not a good candidate for cleaning thin gate oxides after polycide etch.

SUMMARY OF THE INVENTION

It is an object of this invention to provide an improved method for removing photoresist and polymer residues from the surface of an integrated circuit wafer after a plasma etch of a gate electrode structure with minimal plasma damage and minimal loss of gate oxide. The polymer residues comprise sidewall polymer and a veil polymer formed over the surface of the residual photoresist.

It is another object of this invention to provide a method for removing photoresist and polymer residues from the surface of an integrated circuit wafer by an entirely dry etching procedure.

It is yet another object of this invention to provide a method for removing photoresist and polymer residues from the surface of an integrated circuit wafer after plasma etch of a gate electrode over a gate oxide under 100 Å thick.

These objects are accomplished by ashing said photoresist and residual polymers in a plasma asher capable of soft etching using a sequence of in-situ etch steps in $O_2/N_2$ and $O_2$/fluorocarbon mixtures at a single temperature. Soft etching in the context used by this invention means that the sheath voltage of the plasma is kept low and the ion density in the plasma is high. This is accomplished by supplying energy to the plasma and to the substrate by independent means. Such conditions are attainable in ICP(inductively coupled plasma) and HDP(high density plasma) reactors. Under these conditions ion bombardment of the wafer is minimized while a workable ashing rate can be achieved.

Alternately, these objects may also be accomplished in the same plasma reactor by using a plasma containing $O_2$, $N_2$, and $H_2$ with an accompanying substrate temperature cycle whereby the veil polymer is first removed at a low substrate temperature and the sidewall polymer and photoresist are then removed at a higher temperature.

DESCRIPTION OF THE PREFERRED EMBODIMENTS

Figure 1:
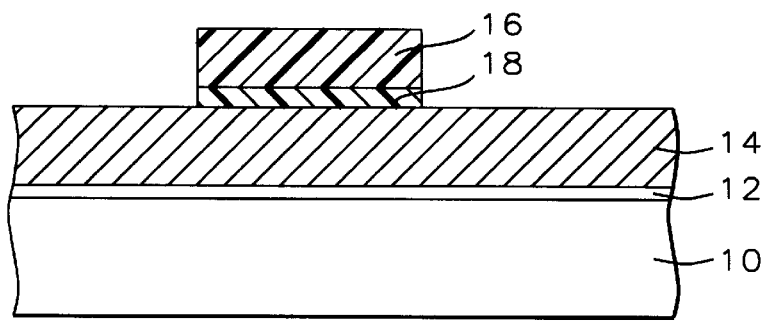
FIG. 1 and FIG. 2 are cross sections illustrating steps of an etching process for forming a polysilicon or polycide gate electrode.
Figure 2:
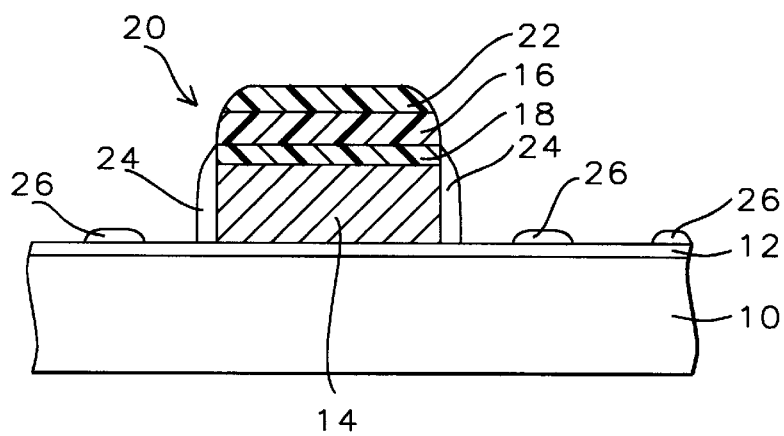
Figure 3:
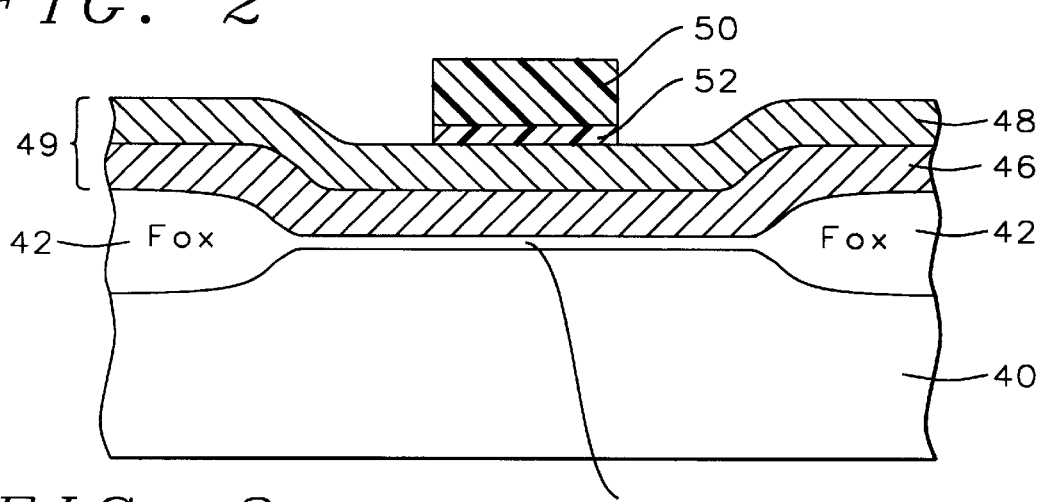
FIG. 3 and FIG. 4 are cross sections of a semiconductor wafer showing the etching process of gate electrode of a self-aligned polycide gate MOSFET with a thin gate oxide illustrating the formation of various residues which are removed by the cleaning procedures taught by the current invention.

In an embodiment of this invention a 200 mm p-type monocrystalline silicon wafer is provided. A polycide gate is formed over a thin gate oxide. Referring to FIG. 3, there is shown a cross section of the silicon wafer 40, illustrating the formation of an n-channel MOSFET. Field oxide isolation (FOX) regions 42 are formed on the silicon wafer 40 by the well known process of local oxidation of silicon(LOCOS).

A gate oxide 44 is grown in the exposed silicon regions. The gate oxide is grown in dry oxygen to a thickness of between about 15 and 120 Angstroms. A polysilicon layer 46 is deposited over the gate oxide layer 44 by low pressure chemical vapor deposition(LPCVD). The polysilicon layer 46 is typically undoped and is between about 1,000 and 3,000 Angstroms thick. A second conductive layer 48 comprising $WSi_x$ is deposited over the polysilicon layer 46 forming the polycide layer 49. Alternately another transition metal silicide, for example $TiSi_x$ or $CoSi_x$ may be substituted for the $WSi_x$. The metal silicide layer 48 is between about 500 and 2,000 Angstroms thick. The polysilicon layer 46 may itself be comprised of a lower undoped region and an upper doped region. A photoresist layer 50 with a subjacent organic BARC 52 is deposited over the polycide layer 48 and patterned by photolithography to define a gate electrode.

Figure 4:
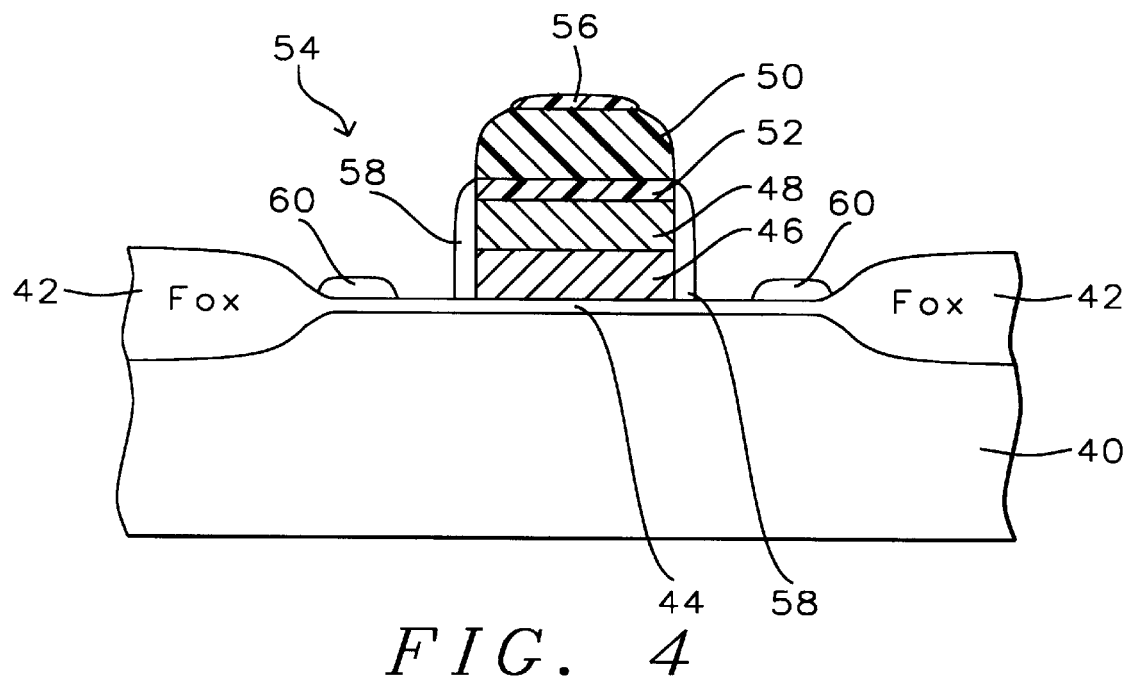

Referring to FIG. 4, the polycide layer 49 is anisotropically etched down to the gate oxide 44 thereby forming the gate electrode 54. The etching is preferably accomplished in a HDP(high density plasma) reactor. The etchants used are selected to provide a high polysilicon-to-silicon oxide selectivity so that the gate oxide layer functions as an etch stop and further permits an over etch period wherein residual pockets of polysilicon are removed. Anisotropic etching of the two layer gate electrode 54 is accomplished by anisotropic plasma etching using etchants containing chlorine, for example $Cl_2$, or $CCl_4$. The etching of the two layers is performed in a single operation in an HDP reactor by first etching upper layer 48 with a first combination of reactants and conditions and then etching the lower layer 46 with a second combination.

The $WSi_x$ layer 48 is etched in a gas mixture of $Cl_2$ at a flow rate of between about 80 and 100 SCCM and a 70% He+30% $O_2$ mixture at a flow rate of between about 3 and 5 SCCM, The flow of the 70% He+30% $O_2$ mixture is adjusted to maintain a pressure of between about 4 and 10 mTorr in the reactor chamber.

The etching tool provides the capability of controlling both the ion density(TCP) and the ion energy(BIAS) of the glow discharge. The $WSi_x$ layer 18 is etched at an rf discharge of 200 Watts TCP or thereabout and 100 Watts BIAS. The rf discharge is maintained until an endpoint is reached. The endpoint is determined by optical emission spectroscopy by the observation of the change of the $SiCl_x$ peak at 405 nm. This endpoint indicates that the polysilicon layer has been reached. A 30–50% over etch of the $WSi_x$ is allowed to assure it's over all removal.

The polysilicon layer is then etched with an etchant composition consisting of $Cl_2$ at a flow rate of between about 70 and 90 SCCM, HBr at a flow rate of between about 110 and 130 SCCM in a carrier gas of helium. The flow rate of the carrier gas is adjusted to maintain a pressure of between about 8 and 12 mTorr in the reactor chamber. An rf discharge is having a power of about 250 Watts TCP and about 200 Watts BIAS is struck and maintained until an endpoint is reached. The endpoint is determined by optical emission spectroscopy by observing the decline of a silicon peak at 405 nm. This occurrence signals the appearance of patches of exposed gate oxide and the onset of clearing the surface of polysilicon.

The lower polysilicon layer 46 is etched in two steps, the first, having a low polysilicon/oxide selectivity for removing the bulk of the layer and the second having a high polysilicon/oxide selectivity in order to avoid penetration of the thin underlying gate oxide. The final high polysilicon/silicon oxide selectivity etch is performed with an etchant composition consisting of $Cl_2$ at a flow rate of between about 70 and 90 SCCM, HBr at a flow rate of between about 110 and 130 SCCM in a carrier gas of helium. The flow rate of the carrier gas is adjusted to maintain a pressure of between about 8 and 12 mTorr in the HDP reactor chamber.

An rf discharge is having a power of about 250 Watts TCP and about 200 Watts BIAS is struck and maintained until an endpoint is reached. The endpoint is determined by optical emission spectroscopy by observing the decline of a silicon peak at 405 nm. This occurrence signals the appearance of patches of exposed gate oxide and the onset of clearing the surface of polysilicon.

In order to minimize the loss of gate oxide 44, the etchant composition is now altered to further increase the selectivity of polysilicon over oxide in an over etch period. The over etch removes all vestiges of exposed polysilicon and is performed as a timed etch in an etchant composition consisting of HBr at a flow rate of between about 180 and 220

SCCM, a 70% He+30% $O_2$ mixture at a flow rate of between about 2 and 4 SCCM in a helium carrier gas. The flow of the carrier gas is adjusted to maintain a pressure of between about 55 and 65 mTorr in the reactor chamber. An rf power of about 230 Watts TCP and about 180 Watts BIAS is applied and maintained for an over etch time period of between about 20 and 40 seconds.

The presence of HBr in the etchant gas during the final polysilicon etch step and in the over etch period causes a polymer veil 56 to form over the photoresist layer 50. Polymer sidewalls 58, which protect the gate electrode sidewalls during etching, and occasional polymer patches 60 on the gate oxide 44 surface remain after the gate etch is completed. The procedure for removal of the residual photoresist 50, the organic BARC, and the residual polymers, which is a key feature of the invention, will now be described.

Two methods for removal of the residual photoresist 50, the organic BARC 52 and both the veil polymer 56 and the sidewall polymer 58 and polymer pockets 60 are next described. These methods may be referred to as post polysilicon etch cleaning. Each method described accomplishes complete removal of the photoresist and the polymer residues with less than about 5 Angstroms loss of gate oxide.

METHOD 1

In this procedure the residues are removed by a sequence of etching steps using $O_2$ and $N_2$ to ash the photoresist and a fluorocarbon with $O_2$ to remove the veil. The sequence of steps during the stripping process are outlined in Table I for a preferred set of conditions, and will now be described in detail.

TABLE I

Fully dry process for post polysilicon etch cleaning.

| Step | RF Time (sec) | RF delay (sec) | RF Power (Watts) | Pressure (Torr) | $O_2$ Flow (SCCM) | $N_2$ Flow (SCCM) | $CF_4$ Flow (SCCM) |
|---|---|---|---|---|---|---|---|
| 1 | 0  | 0.1 | 0   | 1.5 | 2,000 | 0   | 0  |
| 2 | 2  | 2   | 950 | 1.1 | 2,000 | 200 | 0  |
| 3 | 45 | 0   | 900 | 1.1 | 4,000 | 200 | 0  |
| 4 | 20 | 0   | 900 | 1.1 | 3,000 | 0   | 30 |
| 5 | 0  | 0.1 | 0   | 1.5 | 2,000 | 200 | 0  |

Initial Gate oxide thickness = 48 ± 3 Å.
Final Gate oxide thickness = 43.6 ± 2 Å.

The wafer 10 is placed into the chamber of an plasma stripping tool. A suitable tool is the Mattson Aspen ICP Strip manufactured by Mattson Technology, Inc., 3550 West Warren Avenue, Fremont, Calif. 94538, U.S.A. This plasma stripper provides a high density, inductively coupled plasma with independent substrate biasing to assure soft etch removal of the residual films. The tool is equipped to handle 200 mm. wafers.

After the evacuating the stripper, a gas flow consisting of between about 1,800 and 2,200 SCCM (Standard cubic centimeters per minute) $O_2$ is begun (Table l, Step 1). The chamber pressure is adjusted to between about 1.3 and 1.7 Torr or thereabout by throttling the pumping speed.

The substrate wafer 10 is brought to a temperature of between about 200 and 300° C. After about 10 seconds, nitrogen is admitted into the oxygen gas flow at a flow rate of between about 150 and 250 SCCM (Table I, step 2). The pressure in the chamber is throttled to between about 1.0 and 1.2 Torr, an RF power of between about 850 and 1,050 Watts is applied, and a plasma is ignited. After an initial period of about 2 to 4 seconds the RF power is reduced to between about 800 and 950 Watts and the $O_2$ flow rate is increased to between about 3,600 and 4,400 SCCM while retaining the previous $N_2$ gas flow and a chamber pressure of between about 1.0 and 1.2 Torr (Table I, step 3). These conditions are maintained over a period of between about 40 and 50 seconds whereupon the residual photoresist is removed. The addition of $N_2$ to the gas flow increases the ashing rate of the photoresist. After the photoresist removal by steps 2 and 3, the $O_2$ flow rate is reduced to between about 2,700 and 3,300 SCCM, the $N_2$ flow is halted and a flow of between about 27 and 33 SCCM of $CF_4$ is begun. The chamber pressure is kept at between about 1.0 and 1.2 Torr. The RF power is maintained at between about 800 and 950 Watts for a period of between about 18 and 22 seconds whereupon the veils are removed. It should be understood that the method of the invention is not confined to the use of $CF_4$ alone, but may be exercised with other fluorocarbons as well as with other fluorine containing gases such as $NF_3$, with similar results.

In the final step the RF power is removed and the $CF_4$ gas flow is replaced by a $N_2$ gas flow at between about 150 and 250 SCCM for a period of about 10 seconds to flush out the residual fluorocarbons and etch products. The $O_2$ flow rate is also reduced during this period to between about 1,800 and 2,200 SCCM and the pressure within the reactor chamber is increased to between about 1.3 and 1.7 Torr by throttling the pumping speed.

Figure 5:
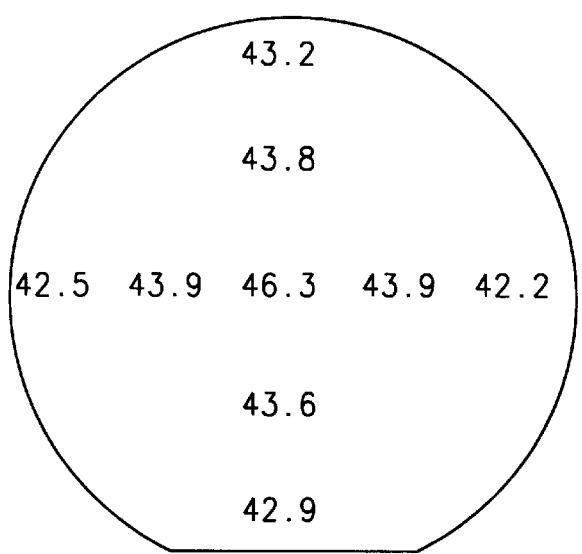
FIG. 5 is a planar view of a silicon wafer with a thin oxide layer showing the thicknesses of the oxide layer after exercising the a first post polysilicon etch cleaning process taught by the invention.

The wafer 10 is removed from the plasma ashing tool and preferably rinsed in Dl(deionized) water and dried. Alternately, the wafer may be given an RCA cleaning without HF after the dry cleaning procedure. FIG. 5 is a planar view of a 200 mm wafer showing the distribution of oxide thicknesses at various locations after processing with the conditions listed in Table I. The initial oxide thickness was 48±3 Å. The least amount of oxide loss occurs in the central portion with the loss amount increasing toward the wafer edges.

Figure 6:
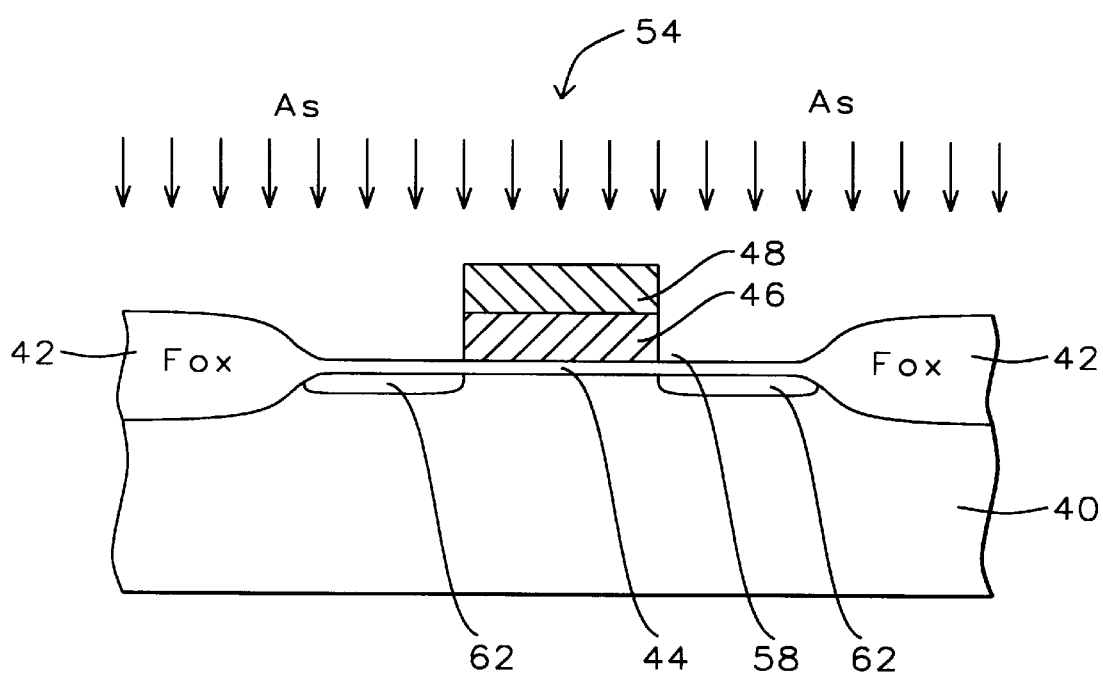
FIG. 6 is a cross section illustrating implantation.

After the post polysilicon etch cleaning procedure just described, the wafer is then further processed by the implantation of n-type impurity ions, for example arsenic, to form LDD (lightly doped drain diffusions) 62 as shown in FIG. 6.

METHOD 2

In this procedure the residues are removed by a dry etching in an ashing tool in a plasma containing hydrogen. A suitable tool is the GaSonics Model PEP351OA, manufactured by GaSonics International, 2730 Junction Avenue, San Jose, Calif. Stripping is begun by using $O_2$, $N_2$, with added $H_2$ to first at a low temperature to remove the polymer veil over the photoresist. The wafer temperature is then elevated to about 250° C. whereupon the photoresist and sidewall and surface polymers are removed. The hydrogen is conveniently and safely provided by using forming gas, which comprises nitrogen with between about 5 and 10 percent added hydrogen. In Table II, shows a set of conditions for the two step process.

TABLE II

Fully dry process for post polysilicon etch cleaning.

| Step | Substrate Temperature (° C.) | Time (sec) | RF Power (Watts) | Pressure (Torr) | $O_2$ Flow (SCCM) | Forming Gas Flow (SCCM) |
|---|---|---|---|---|---|---|
| 1 | 130 | 90 | 900 | 1.2 | 2,000 | 400 |
| 2 | 275 | 60 | 1,100 | 1.2 | 2,000 | 400 |

Initial Gate oxide thickness = 48 ± 3 Å.
Final Gate oxide thickness = 43.6 ± 2 Å.

After the evacuating the stripper, the wafer 10 is heated to a temperature of between about 120 and 140° C. A gas flow consisting of between about 1,800 and 2,200 SCCM $O_2$ and forming gas at a flow rate of between about 360 and 440 SCCM is begun (Table II, Step 1). The chamber pressure is adjusted to between about 1.1 and 1.3 Torr or thereabout by throttling the pumping speed. RF power of between about 850 and 950 Watts is applied for a period of between about 80 and 100 seconds during which time the hard veil is removed. The temperature of the wafer 10 is next raised to between about 225 and 275° C. without interrupting the gas flow or chamber pressure. RF power is then applied at between about 1,000 and 1,200 Watts for a period of between about 55 and 65 seconds to remove the residual photoresist and sidewall polymer (Table II, step 2). The gas flows and chamber pressure in the second step are identical to those used in the first step. After the second step, the wafer 10 is removed from the plasma ashing tool and is further processed as cited in Method I.

While this invention has been particularly shown and described with reference to the preferred embodiments thereof, it will be understood by those skilled in the art that various changes in form and details may be made without departing from the spirit and scope of the invention. While the embodiments of this invention utilize a p-type silicon substrate, an n-type silicon substrate could also be used without departing from the concepts therein provided.

What is claimed is:

1. A method for stripping photoresist and cleaning polymer residues from a silicon wafer after plasma etching of a gate electrode comprising:
    (a) providing a silicon wafer having:
        (i) a gate oxide;
        (ii) a conductive layer overlying said gate oxide;
        (iii) a photoresist layer overlying said conductive layer and patterned to define a gate electrode;
    (b) plasma etching said conductive layer to form a gate electrode;
    (c) loading said wafer into an ashing chamber of a plasma asher;
    (d) ashing said photoresist and said polymer residues by the steps of:
        (i) flowing oxygen in said chamber at for a first time period;
        (ii) flowing a first gas mixture containing oxygen and nitrogen in said chamber while initiating and maintaining a gas plasma in said chamber at a first rf power for a second time period;
        (iii) flowing a second gas mixture containing oxygen and nitrogen in said chamber while maintaining a gas plasma in said chamber at a second rf power for a third time period;
        (iv) flowing a third gas mixture containing oxygen and a fluorine containing gas in said chamber while maintaining a gas plasma in said chamber at a third rf power for a fourth time period;
        (v) flowing a fourth gas mixture containing oxygen and nitrogen in said chamber for a fifth time period;
    (e) retrieving said wafer from said plasma asher; and
    (f) rinsing said wafer in de-ionized water and drying said wafer.

2. The method of claim 1 wherein a portion of said conductive layer is polysilicon.

3. The method of claim 1 wherein said plasma etching of said conductive layer is conducted in a plasma containing HBr.

4. The method of claim 1 wherein said plasma asher is an ICP plasma asher.

5. The method of claim 1 wherein said first gas comprising oxygen is flowed at a rate of between about 1,800 and 2,200 SCCM at a chamber pressure of between about 1.3 and 1.7 Torr and said first time period is 10 seconds or thereabout.

6. The method of claim 1 wherein said plasma asher is configured for a 200 mm. diameter wafer and said first rf power is between about 850 and 1,050 Watts.

7. The method of claim 1 wherein said first gas mixture comprises $O_2$ at a flow rate of between about 1,800 and 2,200 SCCM and $N_2$ at a flow rate of between about 150 and 250 SCCM at a chamber pressure of between about 1.0 and 1.2 Torr.

8. The method of claim 1 wherein said second time period is between about 2 and 4 seconds.

9. The method of claim 1 wherein said second gas mixture comprises $O_2$ at a flow rate of between about 3,600 and 4,400 SCCM and $N_2$ at a flow rate of between about 150 and 250 SCCM at a chamber pressure of between about 1.0 and 1.2 Torr.

10. The method of claim 1 wherein said plasma asher is configured for a 200 mm. diameter wafer and second rf power is between about 800 and 950 Watts.

11. The method of claim 1 wherein said third time period is between about 40 and 50 seconds.

12. The method of claim 1 wherein said third gas mixture comprises $O_2$ at a flow rate of between about 2,700 and 3,300 SCCM and said fluorine containing gas at a flow rate of between about 22 and 33 SCCM at a chamber pressure of between about 1.0 and 1.2 Torr.

13. The method of claim 1 wherein said fluorine containing gas is selected from the group consisting of a fluorocarbon, a mixture of fluorocarbons, and $NF_3$.

14. The method of claim 1 wherein said plasma asher is configured for a 200 mm. diameter wafer and third rf power is between about 800 and 950 Watts.

15. The method of claim 1 wherein said fourth time period is between about 18 and 22 seconds.

16. The method of claim 1 wherein said fourth gas mixture comprises $O_2$ at a flow rate of between about 1,800 and 2,200 SCCM and $N_2$ at a flow rate of between about 150 and 250 SCCM at a chamber pressure of between about 1.3 and 1.7 Torr.

17. The method of claim 1 wherein said fifth time period is 10 seconds or thereabout.

18. A method for stripping photoresist and cleaning polymer residues from a silicon wafer after plasma etching a gate electrode comprising:

(a) providing a silicon wafer having:
  (i) a gate oxide;
  (ii) a conductive layer overlying said gate oxide;
  (iii) a photoresist layer overlying said conductive layer patterned to define a gate electrode;
(b) plasma etching said conductive layer to form a gate electrode;
(c) loading said wafer in a chamber of a plasma asher;
(d) removing said photoresist and said polymer residues by the steps of:
  (i) heating said wafer to a first temperature;
  (ii) flowing a gas mixture containing oxygen, hydrogen, and nitrogen in said chamber while initiating and maintaining a gas plasma in said chamber at a first rf power for a first time period;
  (iii) heating said wafer to a second temperature;
  (iv) flowing said gas mixture containing oxygen, hydrogen, and nitrogen in said chamber while maintaining a gas plasma in said chamber at a second rf power for a second time period;
(e) retrieving said wafer from said plasma asher; and
(f) rinsing said wafer in de-ionized water and drying said wafer.

19. The method of claim 18 wherein a portion of said conductive layer is polysilicon.

20. The method of claim 18 wherein said plasma etching of said conductive layer is conducted in a plasma containing HBr.

21. The method of claim 18 wherein said plasma asher is an ICP plasma asher.

22. The method of claim 18 wherein said first temperature is between about 120 and 140° C. and said first time period is between about 80 and 100 seconds.

23. The method of claim 18 wherein said gas mixture comprises $O_2$ at a flow rate of between about 1,800 and 2,200 SCCM and forming gas at a flow rate of between about 150 and 250 SCCM at a chamber pressure of between about 1.0 and 1.2 Torr.

24. The method of claim 18 wherein said plasma asher is configured for a 200 mm. diameter wafer and said first rf power is between about 850 and 950 Watts and said second rf power is between about 1,000 and 1,200 Watts.

25. The method of claim 18 wherein said second temperature is between about 225 and 275° C. and said second time period is between about 55 and 65 seconds.

* * * * *